United States Patent
Xuan et al.

(10) Patent No.: US 10,916,618 B2
(45) Date of Patent: Feb. 9, 2021

(54) ARRAY SUBSTRATE AND METHOD FOR REPAIRING ARRAY SUBSTRATE

(71) Applicant: BOE TECHNOLOGY GROUP CO., LTD., Beijing (CN)

(72) Inventors: Minghua Xuan, Beijing (CN); Xiaochuan Chen, Beijing (CN); Han Yue, Beijing (CN); Ning Cong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/413,040

(22) Filed: May 15, 2019

(65) Prior Publication Data

US 2020/0027944 A1 Jan. 23, 2020

(30) Foreign Application Priority Data

Jul. 20, 2018 (CN) .......................... 2018 1 0803817

(51) Int. Cl.
*H01L 27/32* (2006.01)
*H01L 27/12* (2006.01)
(Continued)

(52) U.S. Cl.
CPC ........ *H01L 27/3276* (2013.01); *H01L 27/124* (2013.01); *H01L 27/156* (2013.01);
(Continued)

(58) Field of Classification Search
None
See application file for complete search history.

(56) References Cited

U.S. PATENT DOCUMENTS

| 9,852,686 B2 | 12/2017 | So et al. |
| 2012/0049761 A1 | 3/2012 | Yu et al. |

(Continued)

FOREIGN PATENT DOCUMENTS

| CN | 101916547 A | 12/2010 |
| CN | 103515408 A | 1/2014 |

(Continued)

OTHER PUBLICATIONS

Office action issued in Chinese Application No. 201810803817.0, dated Oct. 11, 2019, 15 pages.
(Continued)

*Primary Examiner* — Jack S Chen
(74) *Attorney, Agent, or Firm* — Dave Law Group LLC; Raj S. Dave

(57) ABSTRACT

The present disclosure relates to an array substrate and a method for repairing an array substrate. The array substrate includes: a plurality of sub-pixels located on a substrate, each sub-pixel including a driving transistor and a light emitting device, a control electrode of the driving transistor being coupled to a data signal terminal and a first electrode of the driving transistor being coupled to a first voltage terminal, the light emitting device being connected in series between a second electrode of the driving transistor and a second voltage terminal, the sub-pixels including a first sub-pixel and a second sub-pixel adjacent to the first sub-pixel that emits light of the same color as that of the first sub-pixel; and a first repairing line insulated from and intersecting with a connection line between the light emitting device and the second electrode of the driving transistor of the first sub-pixel and a connection line between the light emitting device and the second electrode of the driving transistor of the second sub-pixel.

12 Claims, 4 Drawing Sheets

(51) Int. Cl.
  *H01L 27/15* (2006.01)
  *H01L 51/56* (2006.01)
(52) U.S. Cl.
  CPC ...... *H01L 27/3211* (2013.01); *H01L 27/3248* (2013.01); *H01L 51/56* (2013.01); *H01L 2251/568* (2013.01)

(56) References Cited

U.S. PATENT DOCUMENTS

| | | | |
|---|---|---|---|
| 2015/0161943 A1 | 6/2015 | Shim et al. | |
| 2015/0339975 A1 | 11/2015 | Liu | |
| 2016/0189593 A1* | 6/2016 | Lee | G09G 3/3291 345/691 |
| 2016/0351092 A1 | 12/2016 | Chen et al. | |
| 2017/0047557 A1 | 2/2017 | Qu et al. | |
| 2018/0108679 A1 | 4/2018 | Wu et al. | |
| 2019/0206300 A1 | 7/2019 | Lee et al. | |

FOREIGN PATENT DOCUMENTS

| | | |
|---|---|---|
| CN | 104167181 A | 11/2014 |
| CN | 104700774 A | 6/2015 |
| CN | 105023522 A | 11/2015 |
| CN | 105161517 A | 12/2015 |
| CN | 105741734 A | 7/2016 |
| CN | 106971688 A | 7/2017 |
| CN | 107731878 A | 2/2018 |
| GB | 2549315 A | 10/2017 |
| JP | 3711760 A | 11/2005 |
| WO | 2017189578 A3 | 11/2017 |

OTHER PUBLICATIONS

Office action issued in Chinese Application No. 201810803817.0, dated Jun. 26, 2020, 35 pages.

* cited by examiner

ARRAY SUBSTRATE AND METHOD FOR REPAIRING ARRAY SUBSTRATE

CROSS-REFERENCE TO RELATED APPLICATION

This patent application claims the benefit and priority of China Patent Application No. 201810803817.0, filed Jul. 20, 2018. The entire disclosure of the above application is incorporated herein by reference.

FIELD

The present disclosure relates to a field of display technologies, and in particular, to an array substrate and a method for repairing an array substrate.

BACKGROUND

This section provides background information related to the present disclosure which is not necessarily prior art.

LED display technology has the advantages of self luminescence, wide viewing angle, high contrast, low power consumption, high reaction speed, etc., and therefore becomes increasingly popular.

SUMMARY

This section provides a general summary of the disclosure, and is not a comprehensive disclosure of its full scope of all of its features.

According to a first aspect of the present disclosure, an array substrate is provided. The array substrate includes: a plurality of sub-pixels located on a substrate, each sub-pixel including a driving transistor and a light emitting device, a control electrode of the driving transistor being coupled to a data signal terminal and a first electrode of the driving transistor being coupled to a first voltage terminal, the light emitting device being connected in series between a second electrode of the driving transistor and a second voltage terminal, the sub-pixels including a first sub-pixel and a second sub-pixel adjacent to the first sub-pixel that emits light of the same color as that of the first sub-pixel; and a first repairing line insulated from and intersecting with a connection line between the light emitting device and the second electrode of the driving transistor of the first sub-pixel and a connection line between the light emitting device and the second electrode of the driving transistor of the second sub-pixel.

In an embodiment of the present disclosure, the light emitting device includes one light emitting device connected in series between the second electrode of the driving transistor and the second voltage terminal.

In an embodiment of the present disclosure, the light emitting device includes at least two light emitting devices connected in series between the second electrode of the driving transistor and the second voltage terminal.

In an embodiment of the present disclosure, the array substrate further includes: at least one second repairing line, each of the second repairing lines being insulated from and intersecting with a connection line between each two adjacent light emitting devices; and a third repairing line insulated from and intersecting with the first repairing line and the at least one second repairing line.

In an embodiment of the present disclosure, the light emitting device includes two light emitting devices connected in series between the second electrode of the driving transistor and the second voltage terminal.

In an embodiment of the present disclosure, the light emitting device includes an OLED, a QLED, or a micro LED light emitting device.

In an embodiment of the present disclosure, a voltage of the first voltage terminal is higher than a voltage of the second voltage terminal.

According to a second aspect of the present disclosure, there is provided a method for repairing an array substrate described in the first aspect of the present disclosure. The method includes bypassing a failed light emitting device.

In an embodiment of the present disclosure, the array substrate includes: a plurality of sub-pixels located on a substrate, each sub-pixel including a driving transistor and a light emitting device, a control electrode of the driving transistor being coupled to a data signal terminal and a first electrode of the driving transistor being coupled to a first voltage terminal, the light emitting device being connected in series between a second electrode of the driving transistor and a second voltage terminal, the sub-pixels including a first sub-pixel and a second sub-pixel adjacent to the first sub-pixel that emits light of the same color as that of the first sub-pixel; and a first repairing line insulated from and intersecting with a connection line between the light emitting device and the second electrode of the driving transistor of the first sub-pixel and a connection line between the light emitting device and the second electrode of the driving transistor of the second sub-pixel. In a case where a failure occurs in the light emitting device of the first sub-pixel, the repairing method includes: at intersecting positions, shorting the first repairing line and the connection line of the first sub-pixel and shorting the first repairing line and the connection line of the second sub-pixel; and cutting off a connection between a portion, between the intersecting positions, of the first repairing line and a remaining portion of the first repairing line.

In an embodiment of the present disclosure, the array substrate includes: a plurality of sub-pixels located on a substrate, each sub-pixel including a driving transistor and a light emitting device, a control electrode of the driving transistor being coupled to a data signal terminal and a first electrode of the driving transistor being coupled to a first voltage terminal, the light emitting device being connected in series between a second electrode of the driving transistor and a second voltage terminal, the sub-pixels including a first sub-pixel and a second sub-pixel adjacent to the first sub-pixel that emits light of the same color as that of the first sub-pixel; and a first repairing line insulated from and intersecting with a connection line between the light emitting device and the second electrode of the driving transistor of the first sub-pixel and a connection line between the light emitting device and the second electrode of the driving transistor of the second sub-pixel, wherein the light emitting device includes at least two light emitting devices connected in series between the second electrode of the driving transistor and the second voltage terminal; at least one second repairing line, each of the second repairing lines being insulated from and intersecting with a connection line between each two adjacent light emitting devices; and a third repairing line insulated from and intersecting with the first repairing line and the at least one second repairing line. In a case where the at least two light emitting devices have a failed light emitting device and a normally operated light emitting device, the method includes: bypassing the failed light emitting device by the first repairing line, the second repairing line, and the third repairing line to repair the sub-pixel.

In an embodiment of the present disclosure, during a normal operation of a repaired sub-pixel, a driving current of a drive transistor of the repaired sub-pixel is increased.

In an embodiment of the present disclosure, the method further includes: before bypassing the failed light emitting device by the first repairing line, the second repairing line, and the third repairing line to repair the sub-pixel, determine the failed light emitting device as follows: shorting each second repairing line and connection lines between each two adjacent light emitting devices; and providing a detection voltage to the second repairing line to determine the failed light emitting device.

In an embodiment of the present disclosure, the light emitting device includes a first light emitting device and a second light emitting device which are sequentially connected in series between the second electrode of the driving transistor and the second voltage terminal, and a voltage of the first voltage terminal is higher than a voltage of the second voltage terminal. The shorting each second repairing line and connection lines between each two adjacent light emitting devices includes: at a first intersecting position where the second repairing line intersects with a first connection line between the first light emitting device and the second light emitting device, shorting the second repairing line and the first connection line. In a case where a failure occurs in the first light emitting device, the method includes: at a second intersecting position where the first repairing line intersects with a second connection line between the first light emitting device and the second electrode of the driving transistor, shorting the first repairing line and the second connection line; at a third intersecting position where the third repairing line intersects with the first repairing line, shorting the third repairing line and the first repairing line, and at a fourth intersecting position where the third repairing line intersects with the second repairing line, shorting the third repairing line and the second repairing line; cutting off the first repairing line at a side of the third intersecting position away from the second intersecting position from; and cutting off a connection between a portion, between the first intersecting position and the fourth intersecting position, of the second repairing line and a remaining portion of the second repairing line.

In an embodiment of the present disclosure, the light emitting device includes a first light emitting device and a second light emitting device which are sequentially connected in series between the second electrode of the driving transistor and the second voltage terminal. A voltage of the first voltage terminal is higher than a voltage of the second voltage terminal. Shorting each second repairing line and connection lines between each two adjacent light emitting devices includes: at a first intersecting position where the second repairing line intersects with a first connection line between the first light emitting device and the second light emitting device, shorting the second repairing line and the first connection line. In a case where a failure occurs in the second light emitting device, the method includes: cutting off a connection between a portion, corresponding to the sub-pixel where the second light emitting device is located, of the second repairing line, and other portions of the second repairing line, wherein, in a case where a failure occurs in the second light emitting device, during a normal operation of the sub-pixel in which the second light emitting device is located, a voltage V equal to a turn-on voltage drop of a light emitting device is applied to the portion, corresponding to the sub-pixel where the second light emitting device is located, of the second repairing line.

In an embodiment of the present disclosure, the shorting includes welding by a laser.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Figure 1:
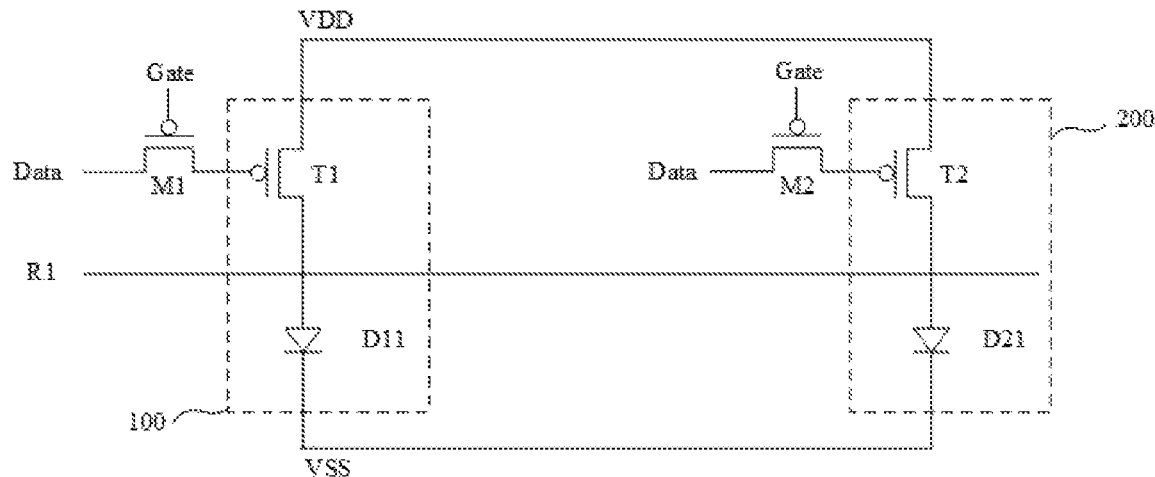
FIG. 1 shows a plan schematic view of an array substrate in accordance with an embodiment of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively. Likewise, the terms "include", "including" and "or" should all be construed to be inclusive, unless such a construction is clearly prohibited from the context. Where used herein the term "examples," particularly when followed by a listing of terms is merely exemplary and illustrative, and should not be deemed to be exclusive or comprehensive.

Additionally, further to be noted, when the elements and the embodiments thereof of the present application are introduced, the articles "a/an", "one", "the" and "said" are intended to represent the existence of one or more elements. Unless otherwise specified, "a plurality of" means two or more. The expressions "comprise", "include", "contain" and "have" are intended as inclusive and mean that there may be other elements besides those listed. The terms such as "first" and "second" are used herein only for purposes of description and are not intended to indicate or imply relative importance and the order of formation.

The flow diagrams depicted herein are just one example. There may be many variations to this diagram or the steps (or operations) described therein without departing from the scope of this disclosure. For instance, the steps may be performed in a differing order or steps may be added, deleted or modified. All of these variations are considered a part of this disclosure.

Example embodiments will now be described more fully with reference to the accompanying drawings.

At present, in order to improve the yield of a display panel, during the manufacturing of an array substrate, it is necessary to detect whether an abnormality occurs in each pixel of the array substrate. For example, the abnormality is that the pixel does not emit light. If there are abnormal pixels, the abnormal pixels need to be repaired.

In an embodiment of the present disclosure, an array substrate which can be used to repair pixels in which an abnormality occurs is provided. It should be noted that, "abnormality" herein may refer to a malfunction in a light emitting device of a pixel. For example, "abnormality" may indicate that the light emitting device fails to emit light or a turn-on voltage and a turn-on current of the light emitting device are too high to operate normally within the voltage range or the current range provided by the display panel. In addition, "abnormality" may also refer to that the light emitting device doesn't emit light due to poor lapping of the cathode or the anode caused by poor bonding when a light emitting device such as an LED is transferred to a substrate.

An array substrate according to an embodiment of the present disclosure includes a substrate and a plurality of sub-pixels located on the substrate. Each sub-pixel includes a driving transistor and a light emitting device. A control electrode of the driving transistor is coupled to a data signal terminal, and a first electrode of the driving transistor is coupled to a first voltage terminal. The light emitting device is connected in series between a second electrode of the driving transistor and a second voltage terminal. The sub-pixels may include a first sub-pixel and a second sub-pixel adjacent to the first sub-pixel that emits light of the same color as that of the first sub-pixel. The array substrate may further include a first repairing line. The first repairing line is insulated from and intersects with a connection line between the light emitting device and the second electrode of the driving transistor of the first sub-pixel and a connection line between the light emitting device and the second electrode of the driving transistor of the second sub-pixel.

On one hand, in an embodiment of the present disclosure, the light emitting device may include one light emitting device connected in series between the second terminal of the driving transistor and the second voltage terminal, for example, as shown in FIG. 1.

FIG. 1 shows a plan schematic view of an array substrate in accordance with an embodiment of the present disclosure. As shown in FIG. 1, sub-pixels in an array substrate 10 includes a first sub-pixel 100 and a second sub-pixel 200 adjacent to the first sub-pixel 100 that emits light of the same color as that of the first sub-pixel 100. According to an embodiment of the present disclosure, the sub-pixels may include, for example, red, green, or blue sub-pixels. It should be understood that, the two sub-pixels 100 and 200 shown in FIG. 1 are merely exemplary so as to make those skilled in the art more easily understand the present disclosure, which should not be construed as a limit to the present disclosure. As an example, the first sub-pixel 100 and the second sub-pixel 200 may both emit red light, green light, blue light, etc. In FIG. 1, the first sub-pixel 100 and the second sub-pixel 200 include only one light emitting device.

As shown in FIG. 1, the first sub-pixel 100 includes a driving transistor T1 and a light emitting device D11, and the second sub-pixel 200 includes a driving transistor T2 and a light emitting device D21. In the first sub-pixel 100, a control electrode of the driving transistor T1 is coupled to a data signal terminal Data, a first electrode of the driving transistor T1 is coupled to a first voltage terminal VDD, a first terminal of the light emitting device D11 is coupled to a second terminal of the driving transistor T1, and a second terminal of the light emitting device D11 is coupled to a second voltage terminal VSS. In the second sub-pixel 200, a control electrode of the driving transistor T2 is coupled to the data signal terminal Data, a first terminal of the driving transistor T2 is coupled to the first voltage terminal VDD, a first terminal of the light emitting device D21 is coupled to a second terminal of the driving transistor T2, and a second terminal of the light emitting device D21 is coupled to the second voltage terminal VSS.

It should be noted that, as shown in FIG. 1, a switch transistor M1 may be connected between the data signal terminal Data and the control electrode of the driving transistor T1 and a switch transistor M2 may be connected between the data signal terminal Data and the control terminal of the driving transistor T2, so as to achieve progressive scanning. However, in order to clearly explain the embodiments of the present disclosure, it is described herein that the control electrodes of the driving transistor T1 and the driving transistor T2 are coupled to the data signal terminal Data, whereas the description of the switch transistor M1 and the switch transistor M2 is omitted.

Further, as shown in FIG. 1, the array substrate 10 further includes a first repairing line R1. In an embodiment of the present disclosure, the first repairing line R1 is suspended. That is, the first repairing line R1 does not transmit a signal. The first repairing line R1 is insulated from and intersects with a connection line between the light emitting device D11 and the second electrode of the driving transistor T1 of the first sub-pixel 100 and a connection line between the light emitting device D21 and the second electrode of the driving transistor T2 of the second sub-pixel 200. Here, as an example, "being insulated from and intersect with" may indicate that the first repairing line R1 is located above or below the above-described connection lines and there may be an insulating layer between the first repairing line R1 and the connection line. It should be understood that, in the context of the present disclosure, the repairing line (such as the first repairing line, the second repairing line, or the third repairing line) being insulated from and intersecting with the connection lines indicates a state in which no repairing line is used for repairing, and after repairing by using the repairing line, according to actual needs, the repairing line may be shorted and the connection line at the intersecting position to achieve the function of repairing.

It should be noted that, the drawings of the present disclosure only show that the transistor is a P-type transistor, which should not be construed as a limit to the present disclosure. It will be appreciated that, a transistor according to an embodiment of the present disclosure may also be an N-type transistor.

On the other hand, in an embodiment of the present disclosure, the light emitting device may include at least two light emitting devices connected in series between the second electrode of the driving transistor and the second voltage terminal.

In this case, the array substrate further includes: at least one second repairing line, each of the second repairing lines being insulated from and intersecting with a connection line between each two adjacent light emitting devices; and a third repairing line insulated from and intersecting with the first repairing line and the at least one second repairing line.

As an example, the light emitting devices may include two light emitting devices connected in series between the second electrode of the driving transistor and the second voltage terminal.

Figure 2:
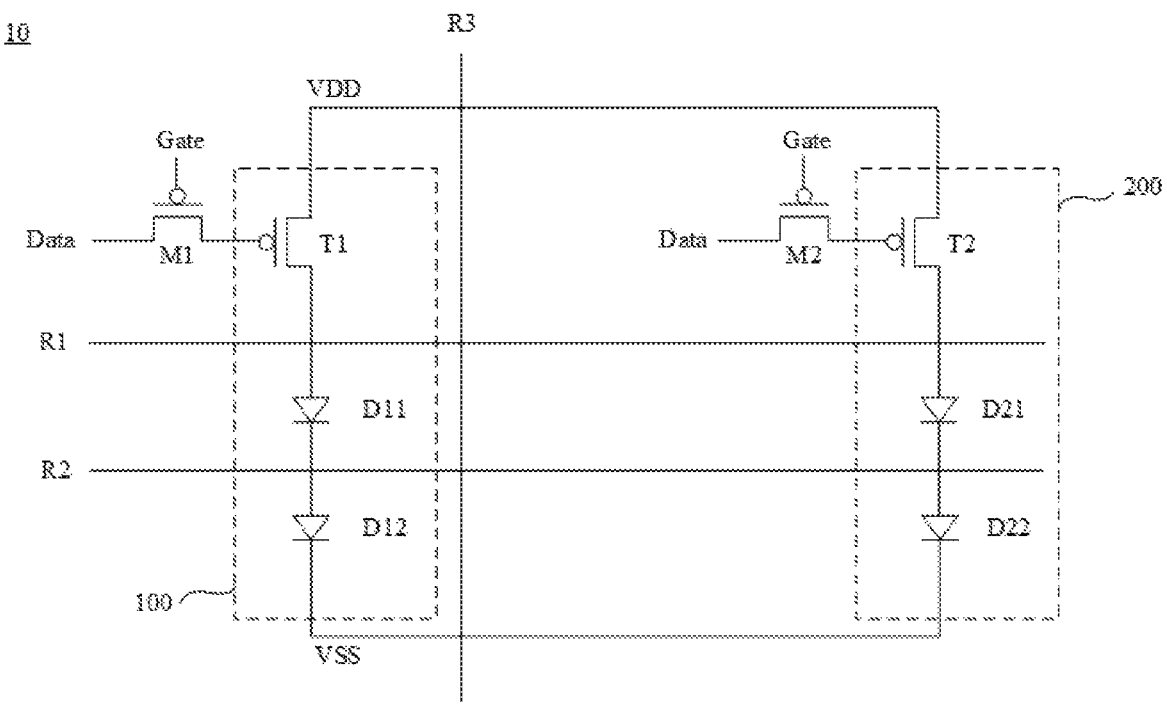
FIG. 2 shows a plan schematic view of an array substrate in accordance with an embodiment of the present disclosure.

FIG. 2 shows a plan schematic view of an array substrate in accordance with an embodiment of the present disclosure. As shown in FIG. 2, a first sub-pixel 100 or a second sub-pixel 200 each includes two light emitting devices. Taking the first sub-pixel 100 as an example, the first sub-pixel 100 includes a first light emitting device D11 and a second light emitting device D12. In the first sub-pixel 100, a control electrode of a driving transistor T1 is coupled to a data signal terminal Data, a first electrode of the driving transistor T1 is coupled to a first voltage terminal VDD, a first terminal of the first light emitting device D11 is coupled to a second electrode of the driving transistor T1, a second terminal of the first light emitting device D11 is coupled to a first terminal of the second light emitting device D12, and a second terminal of the second light emitting device D12 is coupled to a second voltage terminal VSS. It should be understood that, the connection relationship in the second sub-pixel 200 is similar to that of the first sub-pixel 100, and details are not described herein again. Furthermore, it should be understood that, the first and second light emitting devices emit light of the same color.

Further, the array substrate 10 further includes a second repairing line R2 and a third repairing line R3. Specifically, the second repairing line R2 is insulated from and intersects with a connection line between the first light emitting device D11 and the second light emitting device D12. The third repairing line R3 is insulated from and intersects with the first repairing line R1 and the second repairing line R2. For example, according to an embodiment of the present disclosure, the third repairing line R3 may be insulated from and intersects perpendicularly with the first repairing line R1 and the second repairing line R2. Here, the "being insulated from and intersect with" is as described above, and will not be described herein again.

In an exemplary embodiment of the present disclosure, the light emitting device may include an OLED, a QLED, or a micro LED light emitting device.

In an exemplary embodiment of the present disclosure, the voltage of the first voltage terminal is higher than the voltage of the second voltage terminal. As an example, the first voltage terminal may be a power supply voltage terminal and the second voltage terminal may be a ground terminal.

In addition, it should be noted that, in the case where there are no abnormal pixels in the array substrate, the first, second, and third repairing lines are all connected to the ground.

At present, in order to improve the yield of a display panel, during the manufacturing of an array substrate, it is necessary to detect whether an abnormality occurs in each pixel of the array substrate. For example, the abnormality is that the pixel does not emit light. If there are abnormal pixels, the abnormal pixels need to be repaired. To this end, in an embodiment of the present disclosure, there is also provided a method for repairing an array substrate as described above, thus being capable of repairing pixels in which an abnormality occurs of an array substrate. In an embodiment of the present disclosure, the method includes bypassing a failed light emitting device.

On one hand, as described above, in an embodiment of the present disclosure, the light emitting device may include one light emitting device connected in series between the second electrode of the driving transistor and the second voltage terminal, for example, as shown in FIG. 1. The description of FIG. 1 is as described above, and will not be described herein again.

In this embodiment, the repairing method may include using the adjacent sub-pixel that emits light of the same color as that of the failed sub-pixel during normal operation of the pixel, to compensate for the brightness of the failed sub-pixel. That is, a light emitting device that emits light of the same color as that of the failed light emitting device is used for compensating for the brightness of the failed light emitting device.

Figure 3:
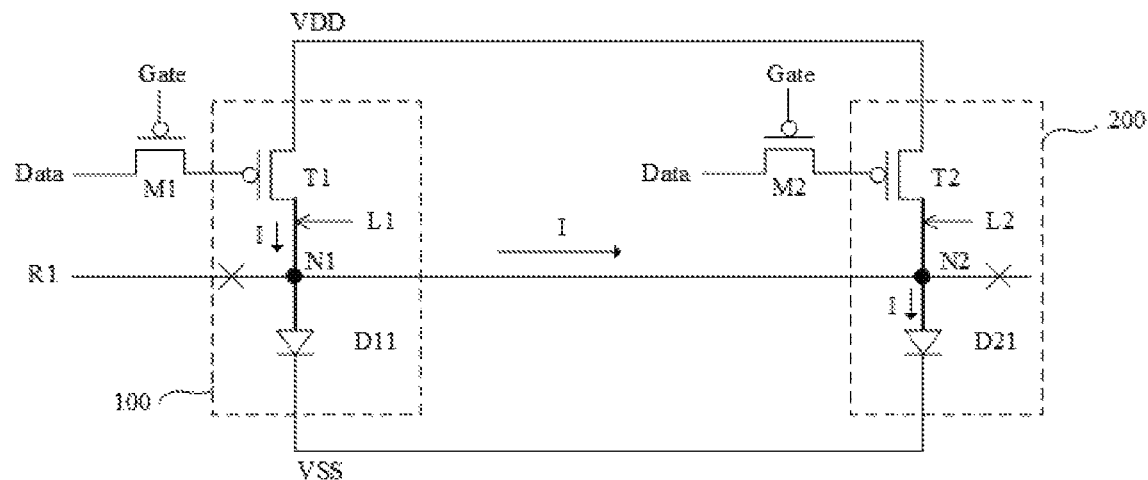
FIG. 3 shows a schematic view of a method for repairing an array substrate in accordance with an embodiment of the present disclosure.

In the case where a failure (for example, does not emit light) occurs in the light emitting device D11 of the first sub-pixel 100 in FIG. 1, the repairing method is as shown in FIG. 3. Specifically, the repairing method includes: shorting, at the intersecting position N1, the first repairing line R1 and the connection line L1 between the light emitting device D11 and the second electrode of the driving transistor T1 of the first sub-pixel 100, and shorting, at the intersecting position N2, the first repairing line R1 and the connection line L2 between the light emitting device D21 and the second electrode of the driving transistor T2 of the second sub-pixel 200; and cutting off a connection between the portion, between the intersecting positions N1 and N2, of the first repairing line R1 and the remaining portion of the first repairing line R1, that is, cutting off the connection between the portion, between the intersecting positions N1 and N2, of the first repairing line R1 and the portion, away from the N2 position from the N1 position, of the first repairing line R1, and cutting off the connection between the portion, between the intersecting positions N1 and N2, of the first repairing line R1 and the portion, away from the N1 position from the N2 position, of the first repairing line R1. It should be noted that, the above shorting includes the welding by laser.

After the above-described repairing, during the normal operation of the first sub-pixel 100, the current I originally flowing from the driving transistor T1 to the light emitting device D11 will sequentially flow through the intersecting position N1, the first repairing line R1, and the intersecting position N2 to the light emitting device D21. Thereby, the brightness of the light emitting device D21 is increased, and thus the failed first sub-pixel 100 may be compensated (that is, the brightness is compensated) by the adjacent second sub-pixel 200 that emits light of the same color as that of the failed first sub-pixel 100.

Similarly, in the case where a failure occurs in the light emitting device D21 of the second sub-pixel 200, the repairing method is similar to that of the case where a failure occurs in the light emitting device D11 of the first sub-pixel 100, and details will not be described herein again.

Figure 4:
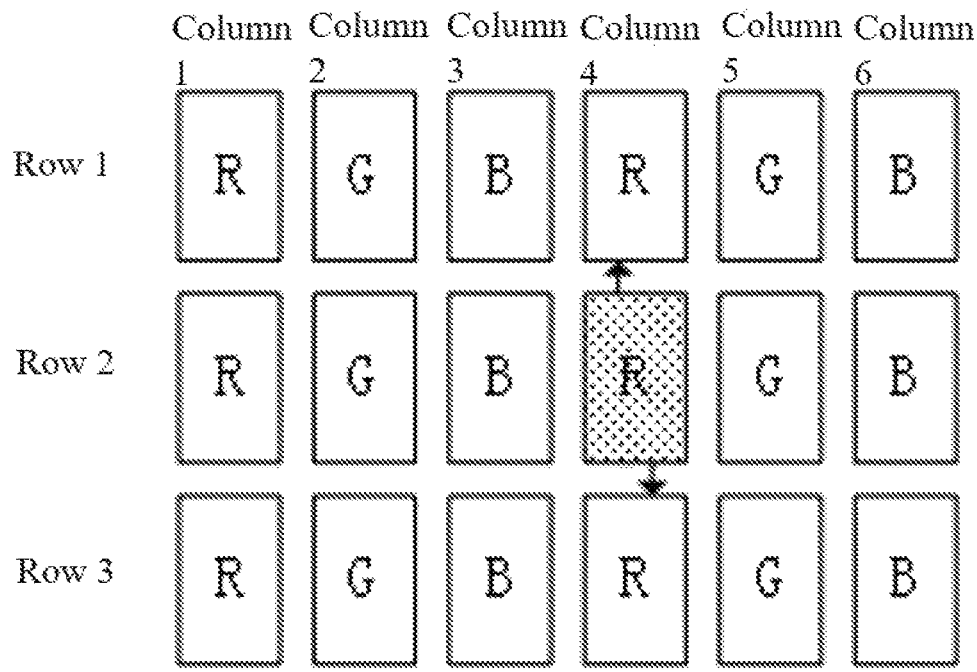
FIG. 4 shows a schematic view of an arrangement of sub-pixels of an array substrate in accordance with an embodiment of the present disclosure.

As an example, as shown in FIG. 4, when a failure occurs in the light emitting device of the sub-pixel R in the second row and the fourth column, the current originally flowing to the sub-pixel R will flow to the sub-pixel, that emits light of the same color as that of the sub-pixel R, adjacent to the sub-pixel R after the above-described repairing, for example, flow to the sub-pixel R in the first row and the fourth column or the sub-pixel R in the third row and the fourth column.

Figure 5:
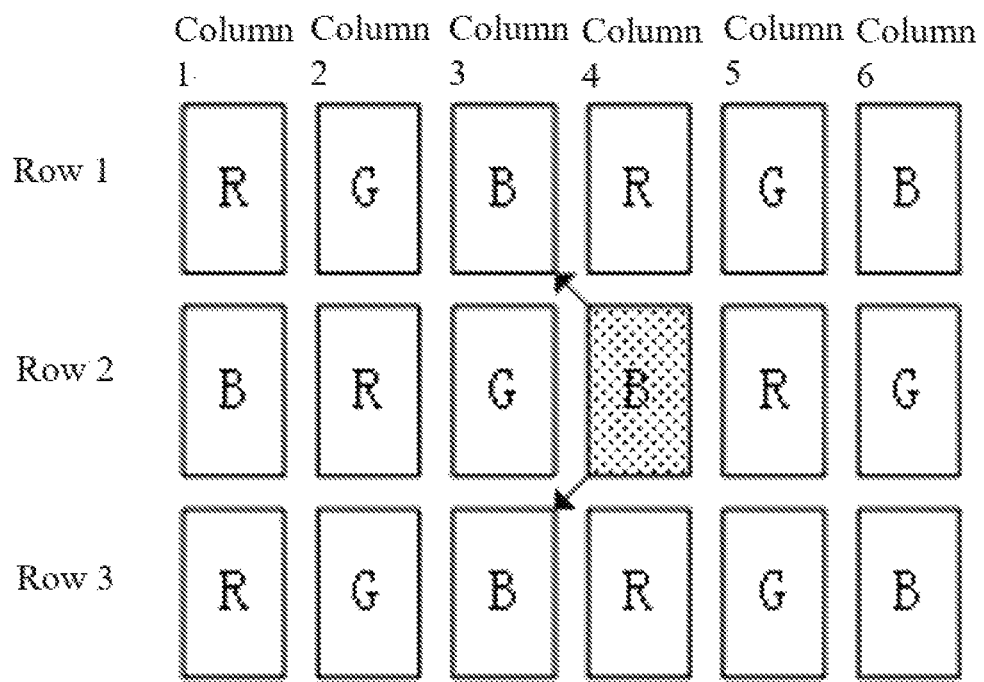
FIG. 5 shows a schematic view of another arrangement of sub-pixels of an array substrate in accordance with an embodiment of the present disclosure.

As another example, as shown in FIG. 5, when a failure occurs in the light emitting device of the sub-pixel B in the second row and the fourth column, the current originally flowing to the sub-pixel B will flow to the sub-pixel, that emits light of the same color as that of the sub-pixel B, adjacent to the sub-pixel B after the above-described repairing, for example, flow to the sub-pixel B in the first row and the third column or the sub-pixel B in the third row and the third column. It should be noted that, which sub-pixel the current flows to may be appropriately determined as needed, for example, by considering the sensitivity of human eyes.

On the other hand, as described above, in an embodiment of the present disclosure, the light emitting devices may include at least two light emitting devices connected in series between the second electrode of the driving transistor and the second voltage terminal. Further, as described above, the array substrate further includes: at least one second repairing line, each of the second repairing lines being insulated from and intersecting with the connection line between each two adjacent light emitting devices; and a third repairing line insulated from and intersecting with the first repairing line and the at least one second repairing line.

In an embodiment of the present disclosure, in the case where at least two light emitting devices within one sub-pixel have a failed light emitting device and a normally operated light emitting device, the repairing method includes: bypassing the failed light emitting device by the first, second, and third repairing lines to repair the sub-pixel. That is, during normal operation of the pixel, the brightness of the failed light emitting device may be compensated by using the normally operated light emitting device within the same pixel.

In an embodiment of the present disclosure, the repairing method further includes: before bypassing the failed light emitting device by the first, second, and third repairing lines to repair the sub-pixel, shorting each second repairing line and the connection lines between each adjacent two light emitting devices; and providing a detection voltage to the second repairing line to determine a position of the failed light emitting device. That is, it is determined that in which light emitting device of the at least two light emitting devices a failure occurs.

As an example, the light emitting devices may include two light emitting devices connected in series between the second electrode of the driving transistor and the second voltage terminal, for example, as shown in FIG. 2. The description of FIG. 2 is as described above, and will not be described herein again.

Figure 6:
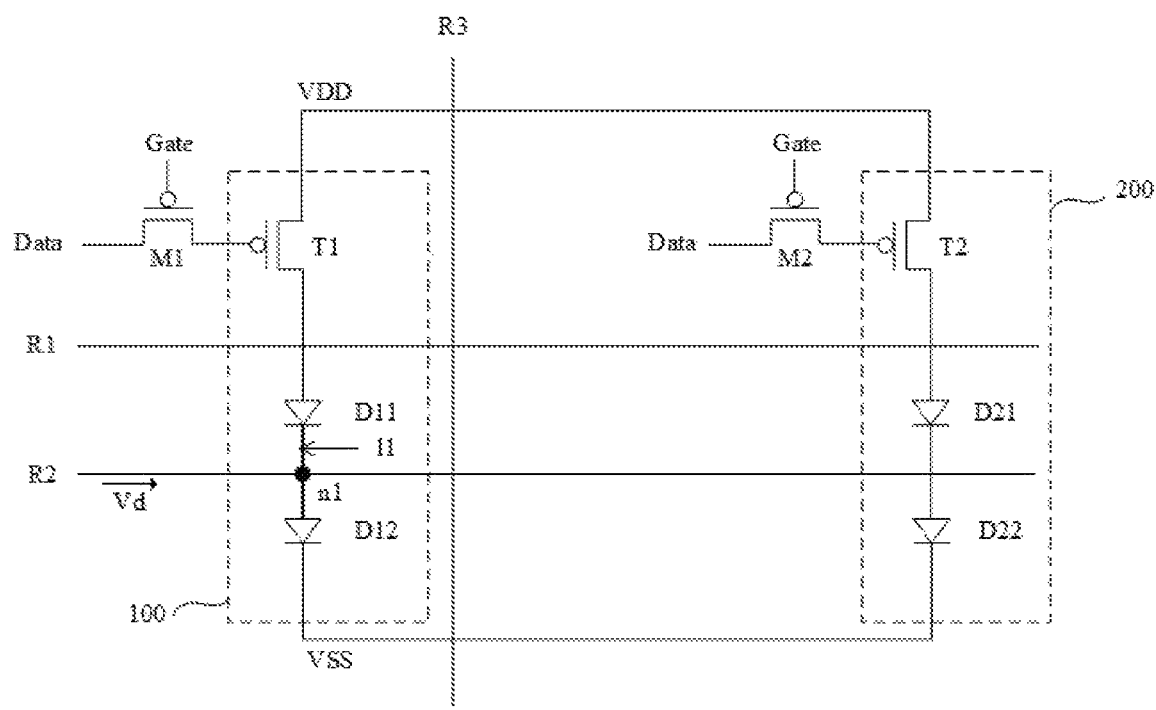
FIG. 6 shows a schematic view of a method for repairing an array substrate in accordance with an embodiment of the present disclosure.

In an embodiment of the present disclosure, as shown in FIG. 6, taking the first sub-pixel 100 as an example, the first sub-pixel 100 includes a first light emitting device D11 and a second light emitting device D12. Shorting the second repairing line and the connection lines between each adjacent two light emitting devices includes: at the first intersecting position n1 where the second repairing line R2 intersects with the first connection line 11 between the first light emitting device D11 and the second light emitting device D12, shorting the second repairing line R2 and the first connection line 11. Then, a detection voltage Vd is provided to the second repairing line R2 to determine in which one of the first light emitting device D11 and the second light emitting device D12 a failure occurs. The case of a failed light emitting device in the second sub-pixel 200 is as described above and will not be described herein again.

Specifically, when determining whether a failure occurs in the first light emitting device D11, the detecting method may include: providing the detection voltage Vd to the second repairing line R2, wherein Vd<VSS, and if the first light emitting device D11 does not emit light, a failure occurs in the first light emitting device D11. When determining whether a failure occurs in the second light emitting device D12, the detecting method may include: providing the detection voltage Vd to the second repairing line R2, wherein VSS<Vd<VDD, and if the first light emitting device D11 emits light but the second light emitting device D12 does not emit light, a failure occurs in the second light emitting device D12.

Next, a specific repairing method will be described in detail by taking the first sub-pixel 100 as an example.

Figure 7:
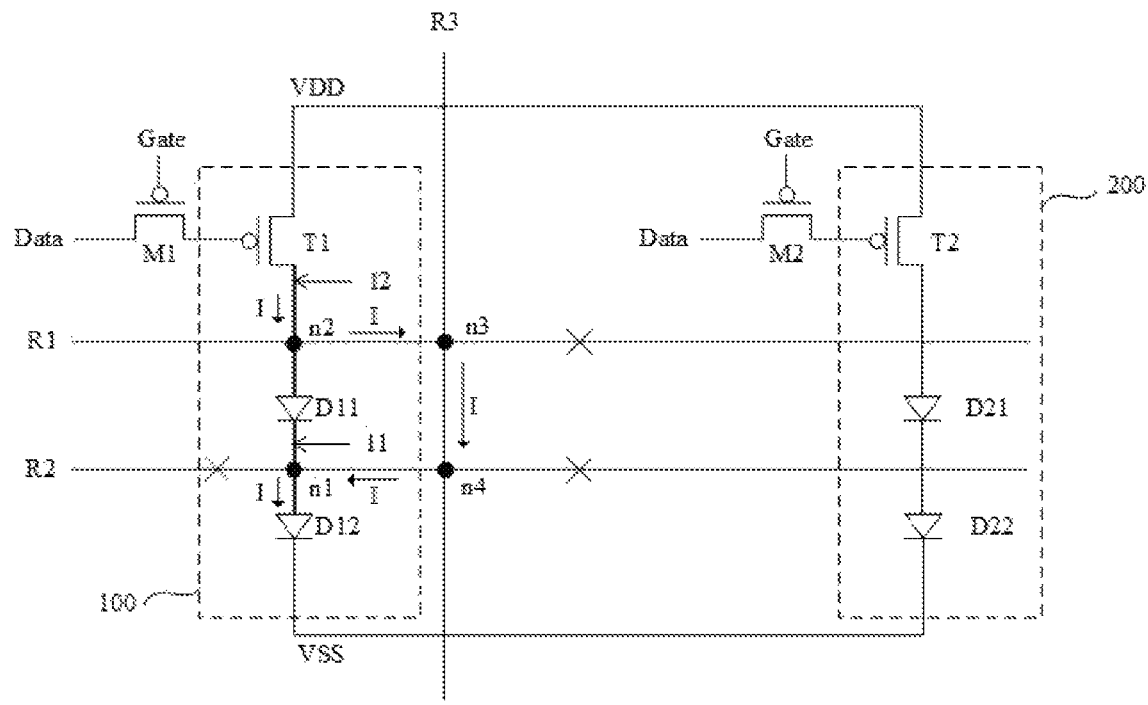
FIG. 7 shows a schematic view of a method for repairing an array substrate in accordance with an embodiment of the present disclosure.

In the case where a failure occurs in the first light emitting device D11, the repairing method is as shown in FIG. 7. Specifically, the repairing method includes: at a second intersecting position n2 where the first repairing line R1 intersects with a second connection line 12 between the first light emitting device D11 and the second electrode of the driving transistor T1, shorting the first repairing line R1 and the second connection line 12; at a third intersecting position n3 where the third repairing line R3 intersects with the first repairing line R1, shorting the third repairing line R3 and the first repairing line R1, and at a fourth intersecting position n4 where the third repairing line R3 intersects with the second repairing line R2, shorting the third repairing line R3 and the second repairing line R2; cutting off the first repairing line R1 at a side of the third intersecting position n3 away from the second intersecting position n2 from; and cutting off a connection between the portion, between the first intersecting position n1 and the fourth intersecting position n4, of the second repairing line R2 and the remaining portion of the second repairing line R2, that is, cutting off the connection between the portion, between the first intersecting position n1 and the fourth intersecting position n4, of the second repairing line R2 and the portion, away from the n4 position from the n1 position, of the second repairing line R2, and cutting off the connection between the portion, between the first intersecting position n1 and the fourth intersecting position n4, of the second repairing line R2 and the portion, away from the n1 position from the n4 position, of the second repairing line R2.

After the above-described repairing, during the normal operation of the first sub-pixel 100, the current I originally flowing from the driving transistor T1 to the first light emitting device D11 and the second light emitting device D12 will sequentially flow through the intersecting position n2, the first repairing line R1, the intersecting position N3, the third repairing line R3, the fourth intersection position n4, the second repairing line R2, and the first intersection position n1 to the second light emitting device D12. Moreover, since the first and second light emitting devices D11, D12 are connected in series, during the normal operation of the repaired first sub-pixel 100, the driving current I of the driving transistor T1 of the repaired first sub-pixel 100 is increased, so as to increase the brightness of the second light emitting device D12, thereby the failed first light emitting device D11 may be compensated (that is, the brightness is compensated) by the second light emitting device D12.

Figure 8:
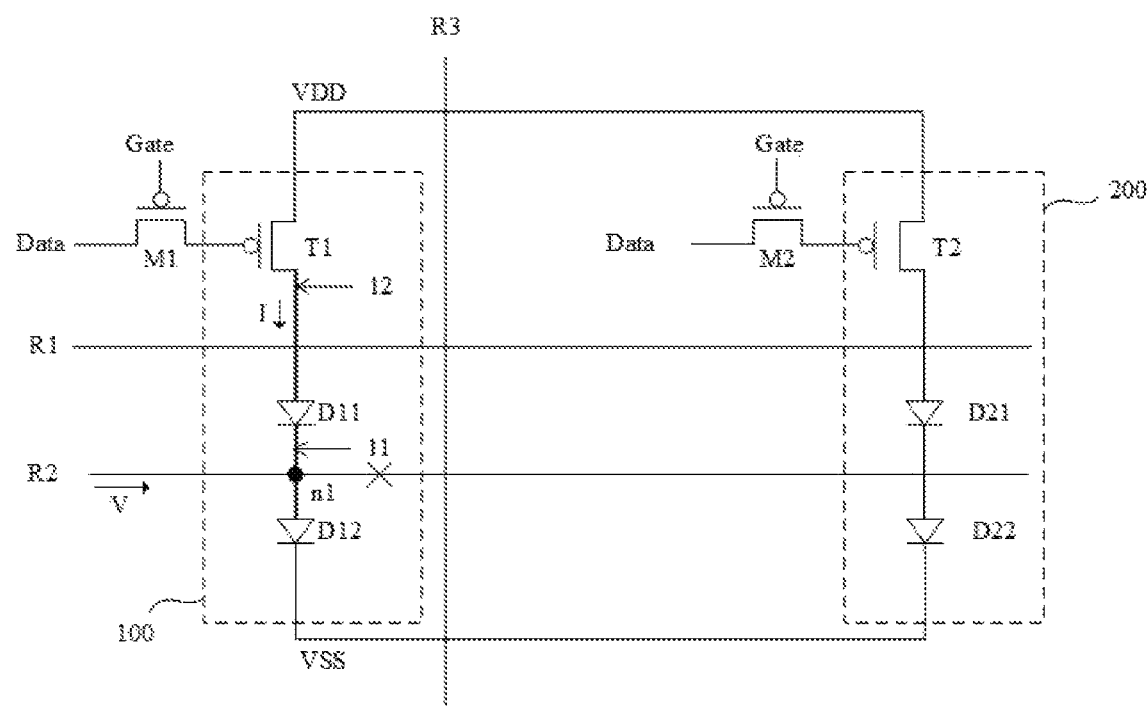
FIG. 8 shows a schematic view of a method for repairing an array substrate in accordance with an embodiment of the present disclosure.

In the case where a failure occurs in the second light emitting device D12, the repairing method is as shown in FIG. 8. Specifically, the repairing method includes cutting off a connection between a portion, corresponding to the first sub-pixel 100 where the second light emitting device D12 is located, of the second repairing line R2 and other portions of the second repairing line R2.

In addition, in the case where a failure occurs in the second light emitting device D12, during the normal operation of the first sub-pixel 100 in which the second light emitting device D12 is located, a voltage V equal to the turn-on voltage drop of the light emitting device is applied to the portion, of the second repairing line R2, corresponding to the first sub-pixel 100 where the second light emitting device D12 is located, thereby the first light emitting device D11 can normally emit light. Moreover, during the normal operation of the repaired first sub-pixel 100, the driving current I of the driving transistor T1 of the repaired first sub-pixel 100 is increased, so as to increase the brightness of the first light emitting device D11, thereby the failed second light emitting device D12 may be compensated (that is, the brightness is compensated) by the first light emitting device D11.

In an exemplary embodiment of the present disclosure, the shorting may include welding by a laser.

In an exemplary embodiment of the present disclosure, the above cutting off may be performed by a laser.

The foregoing description of the embodiments has been provided for purpose of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are included within the scope of the disclosure.

The invention claimed is:

1. An array substrate, comprising:
a plurality of sub-pixels located on a substrate, each sub-pixel comprising a driving transistor and a light emitting device, a control electrode of the driving transistor being coupled to a data signal terminal and a first electrode of the driving transistor being coupled to a first voltage terminal, the light emitting device being connected in series between a second electrode of the driving transistor and a second voltage terminal, the light emitting device in each sub-pixel comprises at least two light emitting devices connected in series between the second electrode of the driving transistor and the second voltage terminal, the sub-pixels comprising a first sub-pixel and a second sub-pixel adjacent to the first sub-pixel that emits light of the same color as that of the first sub-pixel;
a first repairing line insulated from and intersecting with a connection line between the light emitting device and the second electrode of the driving transistor of the first sub-pixel and a connection line between the light emitting device and the second electrode of the driving transistor of the second sub-pixel;
at least one second repairing line, each of the second repairing lines being insulated from and intersecting with a connection line between each two adjacent light emitting devices in each sub-pixel; and
a third repairing line insulated from and intersecting with the first repairing line and the at least one second repairing line.

2. The array substrate according to claim 1, wherein light emitting device in each pixel comprises two light emitting devices connected in series between the second electrode of the driving transistor and the second voltage terminal.

3. The array substrate according to claim 1, wherein the light emitting device in each pixel comprises an OILED, a QLED or a micro LED light emitting device.

4. A method for repairing an array substrate according to claim 1, comprising bypassing a failed light emitting device.

5. The method according to claim 4, wherein the array substrate comprises:
a substrate;
a plurality of sub-pixels located on a substrate, each sub-pixel comprising a driving transistor and a light emitting device, a control electrode of the driving transistor being coupled to a data signal terminal and a first electrode of the driving transistor being coupled to a first voltage terminal, the light emitting device being connected in series between a second electrode of the driving transistor and a second voltage terminal, the sub-pixels comprising a first sub-pixel and a second sub-pixel adjacent to the first sub-pixel that emits light of the same color as that of the first sub-pixel; and
a first repairing line insulated from and intersecting with a connection line between the light emitting device and the second electrode of the driving transistor of the first sub-pixel and a connection line between the light emitting device and the second electrode of the driving transistor of the second sub-pixel,
wherein the light emitting device comprises at least two light emitting devices connected in series between the second electrode of the driving transistor and the second voltage terminal;
at least one second repairing line, each of the second repairing lines being insulated from and intersecting with a connection line between each two adjacent light emitting devices; and
a third repairing line insulated from and intersecting with the first repairing line and the at least one second repairing line,
in a case where the at least two light emitting devices have a failed light emitting device and a normally operated light emitting device, the method comprises: bypassing the failed light emitting device by the first repairing line, the second repairing line, and the third repairing line to repair the sub-pixel.

6. The method according to claim 5, wherein during a normal operation of a repaired sub-pixel, a driving current of a drive transistor of the repaired sub-pixel is increased.

7. The method according to claim 5, further comprising: before bypassing the failed light emitting device by the first repairing line, the second repairing line, and the third repairing line to repair the sub-pixel, determine the failed light emitting device as follows:
shorting each second repairing line and connection lines between each two adjacent light emitting devices; and
providing a detection voltage to the second repairing line to determine the failed light emitting device.

8. The method according to claim 7, wherein the light emitting device comprises a first light emitting device and a second light emitting device which are sequentially connected in series between the second electrode of the driving transistor and the second voltage terminal, and a voltage of the first voltage terminal is higher than a voltage of the second voltage terminal, the shorting each second repairing line and connection lines between each two adjacent light emitting devices comprises: at a first intersecting position where the second repairing line intersects with a first connection line between the first light emitting device and the second light emitting device, shorting the second repairing line and the first connection line, in a case where a failure occurs in the first light emitting device, the method comprises: at a second intersecting position where the first repairing line intersects with a second connection line between the first light emitting device and the second electrode of the driving transistor, shorting the first repairing line and the second connection line; at a third intersecting position where the third repairing line intersects with the first repairing line, shorting the third repairing line and the first repairing line, and at a fourth intersecting position where the third repairing line intersects with the second repairing line, shorting the third repairing line and the second repairing line; cutting off the first repairing line at a side of the third intersecting position away from the second intersecting position; and cutting off a connection between a portion, between the first intersecting position and the fourth intersecting position, of the second repairing line and a remaining portion of the second repairing line.

9. The method according to claim 8, wherein the shorting comprises welding by a laser.

10. The method according to claim 7, wherein the light emitting device comprises a first light emitting device and a second light emitting device which are sequentially connected in series between the second electrode of the driving transistor and the second voltage terminal, and a voltage of the first voltage terminal is higher than a voltage of the second voltage terminal, shorting each second repairing line and connection lines between each two adjacent light emitting devices comprises: at a first intersecting position where the second repairing line intersects with a first connection line between the first light emitting device and the second light emitting device, shorting the second repairing line and the first connection line, in a case where a failure occurs in the second light emitting device, the method comprises: cutting off a connection between a portion, corresponding to the sub-pixel where the second light emitting device is located, of the second repairing line, and other portions of the second repairing line, wherein, in a case where a failure occurs in the second light emitting device, during a normal operation of the sub-pixel in which the second light emitting device is located, a voltage V equal to a turn-on voltage drop of a light emitting device is applied to the portion, corresponding to the sub-pixel where the second light emitting device is located, of the second repairing line.

11. The method according to claim 10, wherein the shorting comprises welding by a laser.

12. The method according to claim 7, wherein the shorting comprises welding by a laser.

* * * * *